United States Patent [19]
Shang et al.

[11] Patent Number: 5,892,328
[45] Date of Patent: Apr. 6, 1999

[54] HIGH-POWER, PLASMA-BASED, REACTIVE SPECIES GENERATOR

[75] Inventors: Quanyuan Shang, San Jose; Kam Law, Union City; Dan Maydan, Los Altos Hills, all of Calif.

[73] Assignee: Applied Komatsu Technology Inc., Tokyo, Japan

[21] Appl. No.: 884,000

[22] Filed: Jun. 27, 1997

Related U.S. Application Data

[63] Continuation of Ser. No. 387,603, Feb. 13, 1995, abandoned.

[51] Int. Cl.$^6$ ........................................................ H01J 7/24
[52] U.S. Cl. ................................ 315/111.51; 315/111.21; 315/112; 313/231.31; 313/17
[58] Field of Search ............................... 315/112, 111.71, 315/111.21, 111.51, 248, 231.31, 17

[56] References Cited

U.S. PATENT DOCUMENTS

| | | | |
|---|---|---|---|
| 2,964,679 | 12/1960 | Schneider et al. | 315/112 |
| 3,753,144 | 8/1973 | Kearns et al. | 331/94.5 |
| 4,492,620 | 1/1985 | Matsuo et al. | 204/192 R |
| 4,654,504 | 3/1987 | Sullivan et al. | 219/121 PM |
| 4,918,031 | 4/1990 | Flamm et al. | 437/225 |
| 4,941,915 | 7/1990 | Matsuoka et al. | 204/298.12 |
| 5,008,593 | 4/1991 | Schlie et al. | 315/39 |
| 5,055,741 | 10/1991 | Schlie | 315/39 |
| 5,124,998 | 6/1992 | Arrigoni et al. | 372/61 |
| 5,235,251 | 8/1993 | Schlie | 315/112 |
| 5,361,016 | 11/1994 | Ohkawa et al. | 315/111.41 |

FOREIGN PATENT DOCUMENTS

| | | |
|---|---|---|
| 0 480 581 A1 | 4/1992 | European Pat. Off. . |
| A-63-199471 | 8/1988 | Japan . |
| A-64-000725 | 4/1989 | Japan . |
| A-536-249 | 7/1972 | Switzerland . |
| A-1-240 031 | 7/1971 | United Kingdom . |
| WO 94/29494 | 12/1994 | WIPO . |

OTHER PUBLICATIONS

Pande et al., "Plasma Enhanced Metal–Organic Chemical Vapor Deposition of Aluminum Oxide Dielectric Film For Device Applications," *J. Appl. Pnys.* 54:5436–5440 (1983).
Pande, et al., "A Novel Low–Temperature Method of SiO$_2$ Film Deposition for Mosfet Applications," *Journal of Electronic Materials*, 13:593–602 (1984).

*Primary Examiner*—Robert J. Pascal
*Assistant Examiner*—Michael Shingleton

[57] ABSTRACT

A plasma-based generator for use with a power source including a plasma tube having a hollow tube body in which a plasma is generated by the power source; a first support structure supporting a downstream end of the plasma tube; and a second support structure holding an upstream end of the plasma tube, the second support structure connected to the first support structure, the second support structure including an expansion joint which changes its length to accommodate a lengthening and a shortening of the plasma tube due to its thermal expansion and contraction when plasma processing is performed within the plasma tube.

23 Claims, 2 Drawing Sheets

HIGH-POWER, PLASMA-BASED, REACTIVE SPECIES GENERATOR

This is a continuation of application Ser. No. 08/387,603 filed Feb. 13, 1995, now abandoned.

BACKGROUND OF THE INVENTION

The invention relates to plasma-based, remote excitation sources for use with processing chambers, e.g. plasma processing chambers.

Plasma based, remote excitation sources or reactive species generators must often be able to handle high input powers and withstand high temperatures combined with a highly reactive chemical environment. For example, in a common application of a reactive species generator, $NF_3$ gas flows into the generator and is broken down by the plasma. The resulting activated species flows out of the generator and into the semiconductor processing equipment where it is used for in-situ chamber cleaning, etching, photo resist stripping, or any of a number of other tasks. As an example of using the reactive species for in-situ chamber cleaning refer to U.S. Ser. No. 08/278,605, entitled "A Deposition Chamber Cleaning Technique Using a Remote Excitation Source" filed on Jul. 21, 1994, and incorporated herein by reference.

The extremely hostile environment to which such equipment is exposed can disable the plasma-based generator very quickly. For example, some generators that are commercially available use quartz tubes to contain the activated species. In those systems, the fluorine that is produced etches the tube quite quickly. Moreover, at high power levels (e.g. above 1 or 1.5 kW) the quartz will tend to break down. Thus, after using the generator only a few times or for a sustained period of operation, the wall of the tube will be become so thin that it will soon collapse under continued exposure to the high temperatures and the vacuums that prevail in such systems. Thus, very early in the life of the tube, it must be discarded and replaced with a new tube. Both the inconvenience and cost of having to repeatedly replace the quartz tube can be quite high.

Some existing plasma-based generators use ceramic tubes in place of the quartz tubes. Ceramic tubes are capable of holding up better than the quartz tubes in the chemically corrosive environments often encountered. But ceramic tubes are not a panacea. They typically have a relatively high thermal expansion coefficient as compared to quartz and other materials. Thus, repeated cycling between room temperature and the high processing temperatures that commonly occur in these systems produces large stresses within the ceramic tubes. These stresses eventually result in the tubes cracking and failing.

Unfortunately, the plasma tubes are not the only components that fail. Seals and O-rings which aid in maintaining a vacuum within the plasma tube also rapidly deteriorate and eventually fail when exposed to the high temperatures produced in such systems.

SUMMARY OF THE INVENTION

In general, in one aspect, the invention is a plasma-based generator for use with a power source. The plasma-based generator includes a plasma tube having a hollow tube body in which a plasma is generated by the power source, a first support structure supporting the downstream end of the plasma tube; and a second support structure holding the upstream end of the plasma tube. The second support structure is connected to the first support structure, and it includes an expansion joint which changes its length to accommodate a lengthening and a shortening of the plasma tube due to its thermal expansion and contraction hen plasma processing is performed within the plasma tube.

In general, in another aspect, the plasma-based generator includes a housing; and a plasma tube supported in the housing. The plasma tube has a hollow body which has an upstream end and a downstream end. During operation, a gas flows into the plasma tube through the upstream end and exits through the downstream end after being activated by a plasma generated therein by a power source. The plasma tube also includes flange located at its downstream end. The housing include a retaining structure retaining the downstream end of the plasma tube by grasping the flange of the plasma tube.

In general, in still another aspect, the plasma-based generator includes a plasma tube in which a plasma is generated by a power source; a first support structure supporting a downstream end of the plasma tube; and a second support structure supporting an upstream end of the plasma tube. The second support structure surrounds the outside of said plasma tube so as to form a cavity around the plasma tube. The support structure includes an inlet port through which a coolant is introduced into the cavity and an outlet port out of which the coolant flows after passing through the cavity. The plasma tube acts as an inner wall of the cavity so that the coolant comes into direct contact with the plasma tube when introduced into the cavity.

Preferred embodiments include the following features. The expansion joint is a bellows having a central bore through which the plasma tube passes. The inlet port is located closer to the downstream end of the plasma tube than is the outlet port. The plasma tube and the outer tube are cylindrically shaped and they are concentrically positioned with respect to each other and with resect to a common axis so as to form a cylindrically shaped flow region surrounding the plasma tube. The expansion joint is located between the outer tube and the upstream end of the plasma tube. The plasma tube is made of a dielectric material that is transparent to microwave energy, e.g. a material selected from a group of materials consisting of sapphire, alumina, aluminum nitride and quartz. The outer tube is also made of a dielectric material that is transparent to microwave energy, e.g. a material selected from a group of materials consisting of quartz, sapphire, alumina, Teflon, plastic, and polystyrene.

Also in preferred embodiments, the first support structure includes a base plate and the second support structure includes a collar member. The flange is located between and grasped by the collar member and the base plate. The plasma-based generator also includes a first gasket circumscribing the downstream end of the plasma tube and compressed between the flange and the base plate to form a vacuum seal. The first gasket is located out on the flange away from the hollow body of the plasma tube so as to protect it from high temperature conditions which occur at the downstream end of the hollow body during plasma processing with the plasma tube. The plasma-based generator also includes a second gasket around the plasma tube and compressed between the flange and the collar member. The second gasket is also located out on the flange away from the hollow body of the plasma tube so as to protect it from high temperature conditions which occur at the downstream end of the hollow body during plasma processing with plasma tube. The first and second gaskets are O-rings.

The plasma-based generator of the invention is generally usable in any application where a remote excitation source might be required.

One advantage of the invention is that the parts which might be vulnerable to high temperatures, such as the O-rings used for vacuum seals, are isolated from exposure to the high temperatures that typically exist in such systems. Thus, those parts are less prone to deteriorating and failing during continued use. In addition, the liquid cooling that is provided keeps the plasma tube and other components at cooler operating temperatures as compared to other conventionally designed plasma-based excitation source. Also, the use of an expansion joint (e.g. a bellows) allows the plasma tube to easily expand and contract in a longitudinal direction. Thus the thermal expansion and contraction does not result in high stresses that would typically lead to damaging or cracking of the plasma tube.

Other advantages and features will become apparent from the following description of the preferred embodiment and from the claims.

DESCRIPTION OF THE PREFERRED EMBODIMENTS

Figure 1:
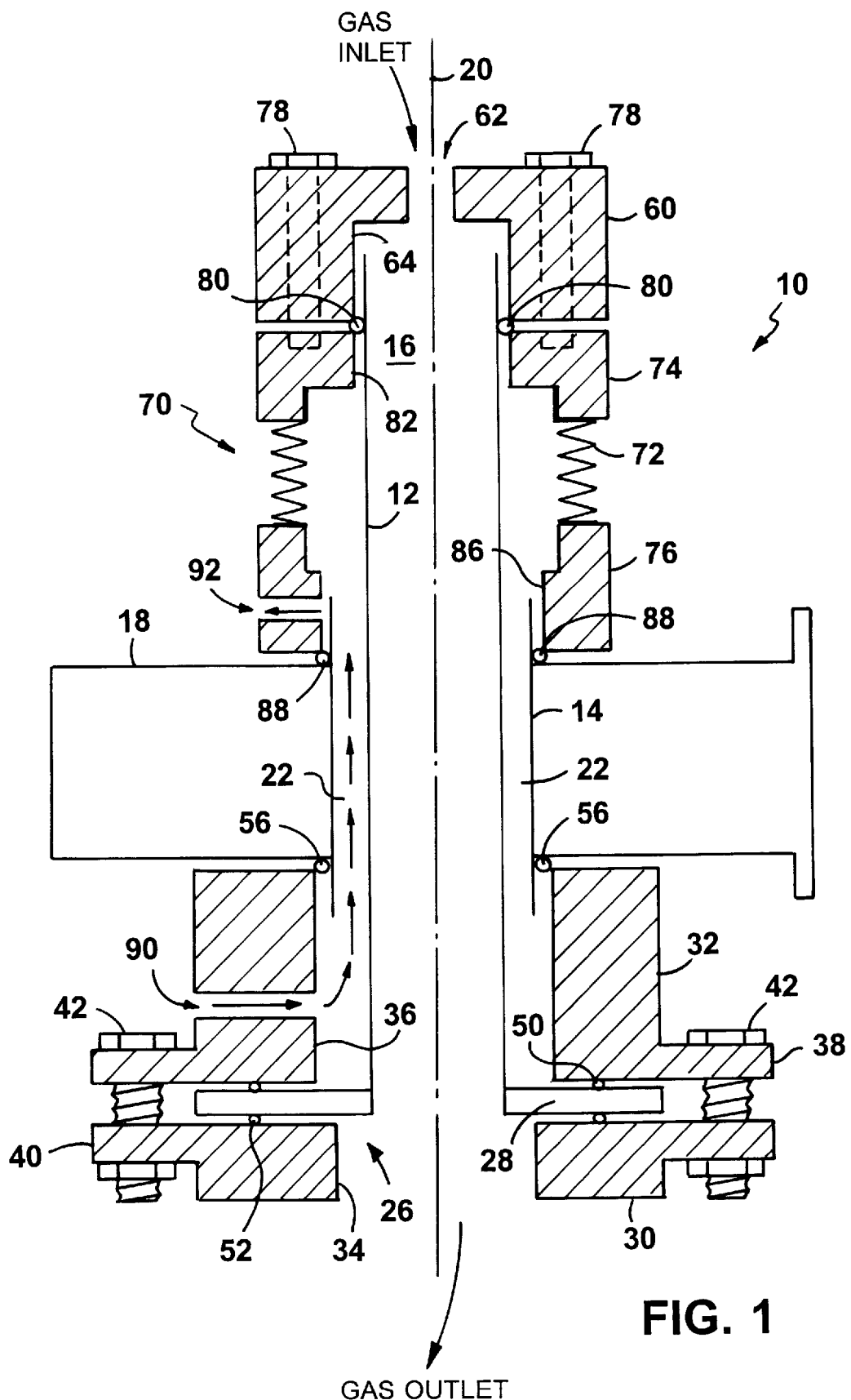
FIG. 1 shows a cross sectional view of the reactive species generator.

Referring to FIG. 1, a reactive species generator 10 constructed in accordance with the invention is a generally cylindrical unit that includes a plasma tube 12 that is contained within larger outer tube 14. Gas passes through a central bore 16 in plasma tube 12 and is broken down by a plasma that is induced by a power source (not shown). Plasma tube is made of a material that is generally transparent to the microwaves and which has a high chemical stability when posed to the reactive plasma (e.g. sapphire, alumina, or aluminum nitride).

Outer tube 14, which is made of a dielectric material that transmits microwaves, functions both as a cooling jacket around plasma tube 12 and as a window through which microwave energy is transmitted into plasma tube 12 to generate a plasma therein. A microwave cavity 18 surrounds outer tube 14. The dimensions of cavity 18 are selected so that when microwaves energy is fed into the cavity a standing wave is produced having a maximum signal value located at the center of the plasma tube, where a plasma is generated.

Outer tube 14 and plasma tube 12 are concentrically arranged about a common axis 20 so as to form therebetween a cylindrical flow region 22 surrounding plasma tube 12. During operation a pump (not shown) flows a coolant (e.g. water) through this cylindrical flow region to cool the outer wall of plasma tube 12.

At a downstream end 26, plasma tube 12 has a flange 28 that extends way from the rest of the tube body. Flange 28 is secured between a base plate 30 and a collar ring 32. Base plate 30 has a circular opening that is aligned with and is larger than the inside bore of plasma tube 12, and collar ring 32 has a central bore 36 having a diameter that is slightly larger than the outer diameter of outer tube 14. Base plate 30 and collar ring 32 have flanges 38 and 40, respectively, each with a regularly spaced array of bolt holes. Bolts 42 passing through the bolt holes, hold collar ring 32 and base plate 30 together with flange 28 secured between them. O-rings 50 and 52 on either side of flange 28 form seals when collar ring 32 is tightened down onto base plate 30. Both O-rings 50 and 52 are significantly larger in diameter than the body of plasma tube 12 and they are concentrically positioned on flange 28 with respect to plasma tube 12 and axis 20 so that they form seals out on flange 28 and away from the high temperatures that occur at the body of plasma tube 12. O-ring 50, which is compressed between the upper surface of flange 28 and collar ring 32, forms a water tight seal for the cooling system which will be described shortly. O-ring 52, which is compressed between the bottom surface of flange 28 and base plate 30, forms a vacuum seal for the inside of plasma tube 12.

Outer tube 14 extends down into 36 central bore of collar ring 32 with an O-ring 56 forming a seal between the two.

A cylindrically shaped top member 60 with a gas inlet port 62 fits over the upstream end of plasma tube 12. Top member 60 has a cylindrical cavity 64 which has an inside diameter that is slightly larger than the outside diameter of plasma tube 13 so that the plasma tube fits into it. A bellows assembly 70, which connects top member 60 to the top end of outer tube 14, includes a stainless steel bellows 72 with an upper ring 74 bonded to one of its ends and a lower ring 76 bonded to the other of its ends. Upper ring 72 possesses an inner bore 82 having the same diameter as the cylindrical cavity 64 in top member 60. Bolts 78 attach upper ring 74 to top member 60, and an O-ring 80 compressed between the outside of plasma tube 12 and top member 60 forms a vacuum seal for the upstream end of the plasma tube.

Lower ring 76 of bellows assembly 70 possesses an inner bore 86 having a diameter that is slightly larger than the outside diameter of outer tube 14. Lower ring 76 abuts the top of microwave cavity 18 and outer tube 14 extends up through microwave cavity 18 into inner bore 86. An O-ring 88 compressed between the outside of outer tube 14 and lower ring 76 just above microwave cavity 14 forms a water tight seal between outer tube 14 and bellows assembly 70.

An inlet port 90 passing in a radial direction through collar ring 32 and into central bore 36 provides a passage through which coolant is introduced into the assembly during operation. The coolant that flows in through the inlet port passes over the plasma tube, up through cylindrical flow region 22 surrounding plasma tube 12 and into the inside of bellows assembly 70 above outer tube 14. An outlet port 92 passing in a radial direction through lower ring 76 of bellows assembly 70 provides a passage through which the coolant leaves the assembly after flowing over and cooling the heated plasma tube. Note that the cooling path is from the hot end of the plasma tube (i.e., its downstream end) toward its cool end (i.e., its upstream end). This produces more efficient cooling of the plasma tube during operation.

Note that both collar ring 32 and lower ring 76 are connected by appropriate means to the housing of microwave cavity so that they both stay fixed relative to the microwave cavity. In the described embodiment, screws (not shown) are used to establish that connection.

During operation, when a plasma is being generated within the plasma tube, the activated gas within the tube gets very hot, which, in turn, makes the plasma tube very hot. As the plasma tube heats up, it expands in a longitudinal or lengthwise direction. The bellows which connects the upstream end of the plasma tube to the base plate accommodate this expansion by readily extending. That is, the bellows allows the plasma tube's lengthwise expansion to occur without hindrance so that no stresses are generated within the tube that might lead to cracking or damaging the plasma tube.

Any of a wide variety of commonly used liquids can be used as a coolant assuming, of course, that its absorption coefficient for microwaves is not too high. If it is too absorptive, it may excessively attenuate the microwave power before it reaches the inside of the plasma tube. Nevertheless, even liquids that tend to be highly absorptive of microwaves can be used if the absorption path length is made sufficiently small. That is, by making the layer of liquid separating the plasma tube from the outer tube sufficiently small its attenuation of the microwave energy can be kept to acceptable levels.

In the described embodiment, $H_2O$ is used as the coolant. Since $H_2O$ tends to absorb microwaves, the radial gap between the plasma tube and the outer tube is kept relatively small (e.g. between 0.1 mm to 0.5 mm, preferably 0.25 mm). For microwave nonabsorbing liquids like Freon or liquid dimethyl polysiloxane, the gap between the two tubes can be quite large, e.g. 3 mm.

In the described embodiment, the O-rings are made of Viton or Kalrez, the latter of which is particularly suited to high temperatures. Note, however, that because of the flange on the plasma tube, the O-rings do not come into contact with the hot plasma tube and thus they are not exposed to very high temperatures. Consequently, other materials that are less resistant to high temperature conditions can also be used for the O-rings.

The flange on the plasma tube can be made in several ways. One way is to start with a tube of ceramic with a very thick wall. Then, using a lathe, most of the material except for the material that will be the flange is cut off. The advantage of this approach is that it produces a completely integrated tube requiring no joints between dissimilar materials that might tend to break or crack from thermal stresses or from thermal cycling. Indeed, this approach requires no joints whatsoever. The disadvantage, of course, is that it can be very expensive, particularly if done only in small quantities. Most of the ceramic material ends up on the floor as waste.

An alternative approach is to make the tube body from sapphire and then attach separately fabricated flanges that are made of either sapphire or metal. The pieces can be bonded together using standard, commonly used techniques. For example, the pieces can be bonded together using a metalization, e.g. brazing. In small quantities, this approach would certainly be less expensive.

As noted above, materials other than sapphire can be used for the plasma tube. Quartz, for example, would be acceptable for some applications. Quartz does not stand up well, however, in highly corrosive environments at high temperatures. Thus, it is more suited for low to medium power applications and the generation of less corrosive activated species.

The thickness of the plasma tube is not particularly critical. In the described embodiment, the tube thickness is about 2 mm. This thickness proves to be both economical and adequately strong. The lower thickness limit is determined by the mechanical strength that is required which, of course also depends on the vacuum that will be used in the tube. The vacuum that the tube will be exposed to and which partly determines the strength requirement for the plasma tube is process dependent. Typically, it will be in a range extending from mTorr to up atmospheric pressures. In any event, the thicker the tube, the stronger it will be. However, if it is too thick, an undesirably large thermal gradient will exist between the heated interior of the tube and its cooled exterior. In fact, the size of the thermal gradient will increase in proportion to the thickness of the tube. Since a thickness of about 2 mm provides sufficient strength, there is no significant advantage to making it thicker.

Since the outer tube is not exposed to high temperatures, it can be made of any of a wider range of materials than are suitable for the plasma tube. Two requirements are that it be sufficiently strong and that it transmit the excitation energy (e.g. the microwaves). Since the outer tube is not exposed to high pressures or high vacuums, its thickness is not particularly critical. Materials which are suitable include quartz, sapphire, alumina, Teflon, plastic, and polystyrene.

The bellows, which is made of stainless steel in the described embodiment, can be readily obtained from commercial sources. For example, suitable bellows can be obtained from Metalfab Corporation of Ormond, Florida. The bellows is metalized (e.g. bonded) to the metal end pieces, i.e., the upper and lower rings. The seal at that bond is not particularly critical since it only needs to be water tight and it need not withstand high pressures or high temperatures. Thus, a suitable epoxy will also produce an acceptable seal.

In the described embodiment, the other metal components of the generator, such as the collar, the top member and the upper and lower rings, are made of stainless steel.

Figure 2:
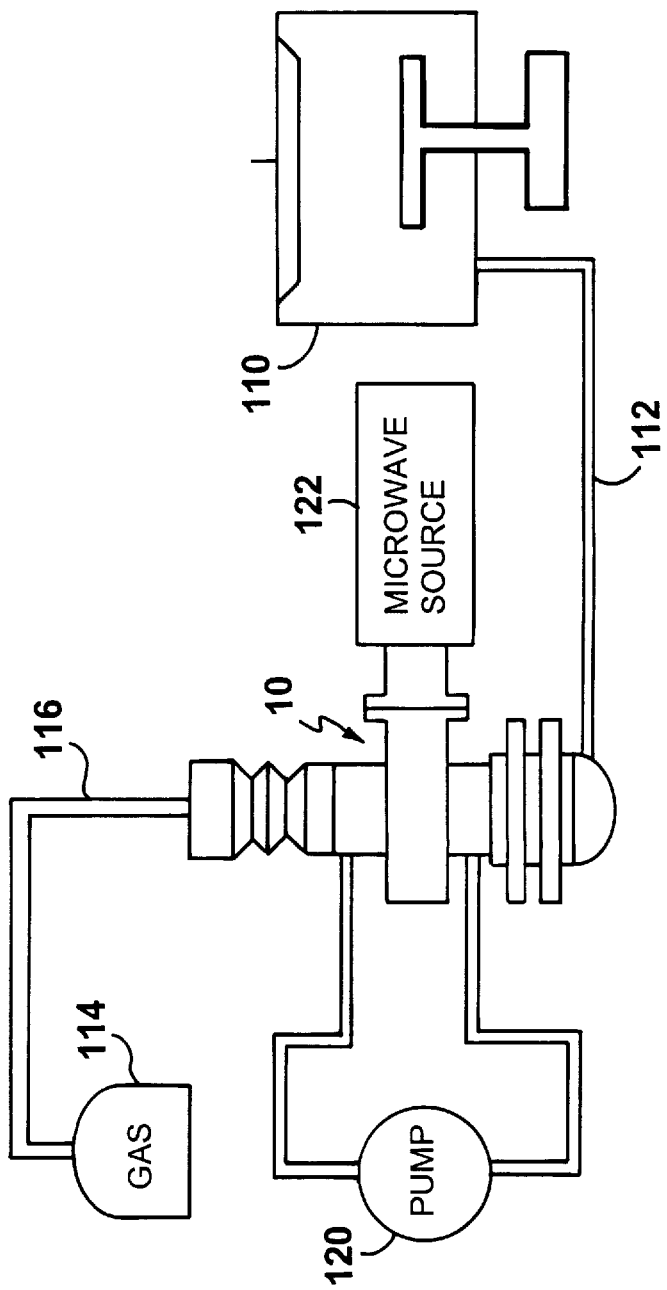
FIG. 2 is a block diagram of a plasma processing system including a remote, plasma-based, reactive species generator.

The plasma based generator described above may be used in a wide variety of applications. For example, it can be used as a remove source of activated gas species in a plasma processing system, such as is illustrated in FIG. 2. In that application, an external gas source 114 supplies a reactive gas to the gas inlet port of generator 10 through a conduit 116. Activated gas species that is produced in generator 10 is, in turn, supplied to a plasma chamber 110 through another conduit 112 connected to the gas outlet port of generator 10. A pump 120 and heat exchanger (not shown) connected between the inlet and outlet ports of the generator's cooling system circulates a coolant through generator 10 when the generator is being operated. A microwave source 122 supplies power to produce the plasma within the plasma tube in the generator to activate the gas species prior to introducing it into the main plasma chamber.

Other components that are typically present in such a system include a vacuum pump for evacuating the plasma chamber, a power source (e.g. an RF supply or a DC supply) for generating a second plasma in the plasma chamber The excited species can be transported to the processing chamber in any way that seems appropriate. As noted already, the activated species can be delivered to the process chamber through a conduit. This has the advantage of allowing the generator to be conveniently placed. Such a conduit would be made of a material that does not interact with the activated species that is being produced, e.g. stainless steel, aluminum, ceramic, or some fluorine based material. Alternatively, the outlet side of the generator can be connected directly into the chamber itself.

In the described embodiment, generator 10 is typically operated at power levels of 1 to 1.5 kwatts and above and pressures in the plasma tube are in the 10 Torr range. With a water flow rate through generator 10 of about 3 liters/min, the coolant temperature will increase about 20°–40° C. as it passes over the heated plasma tube. Thus, if the temperature of the water arriving at the inlet port is about 23° C., the outlet temperature will be about 40°–60° C. With that flow rate, the inside temperature of the plasma tube will be about 200° C.

Though the power delivery system in the described embodiment was a microwave source, it need not be. Indeed, the plasma within the generator can be produced by any of many know mechanisms for generating plasmas. For example, an RF power source could be used, in which case one might wish to wind and inductance coil around the outside of the plasma tube and within the cylindrical flow region. In that case, the composition of the outer tube becomes less critical because energy is not being transmitted through it into the plasma tube.

Still other embodiments are within the following claims. For example, the bellows need not be placed where it is shown in FIG. 1. It can be located anywhere within the generator where it will serve to permit the plasma tube to expand freely in its longitudinal direction when heated by the hot plasma. For example, it could be incorporated into the plasma tube itself, upstream of the plasma where it will not be exposed to the high temperature or corrosive conditions. In that case, it would simply be brazed to the sapphire of the plasma tube. Or it could be incorporated into the collar ring near the downstream end of the plasma tube.

It should also be understood that both the plasma tube and the outer tube could have a different shape from that described above. For example, they could have an oval, a square, a rectangular, or any cross sectional shape that one might consider using in a plasma-based generator.

What is claimed is:

1. A plasma-based generator for use with a power source, said generator comprising:
    a housing; and
    a plasma tube supported in said housing, said plasma tube having a hollow body which has an upstream end and a downstream end, wherein during operation a gas flows into said plasma tube through the upstream end and exits through the downstream end after being activated by a plasma generated therein by said power source, said plasma tube also including a flange securely attached thereto and located at the downstream end of said hollow body;
    wherein said housing comprises a retaining structure retaining the downstream end of said plasma tube by grasping the flange of the plasma tube and wherein said plasma tube comprises sapphire.

2. The plasma-based generator of claim 1 wherein said housing comprises:
    a first support structure supporting the flange of the plasma tube; and
    a second support structure connected to said first support structure, said second support structure supporting the upstream end of said plasma tube,
    wherein said first support structure comprises a base plate and said second support structure comprises a collar member, wherein said flange is located between and grasped by said collar member and said base plate.

3. The plasma-based generator of claim 2 further comprising a first gasket circumscribing the downstream end of said plasma tube and compressed between the flange and the base plate, said gasket forming a vacuum seal.

4. The plasma-based generator of claim 3 wherein said first gasket is located out on said flange away from said hollow body of said plasma tube so as to protect it from high temperature conditions which occur at the downstream end of said hollow body during plasma processing with said plasma tube.

5. The plasma-based generator of claim 4 further comprising a second gasket around said plasma tube and compressed between the flange and said collar member.

6. The plasma-based generator of claim 5 wherein said second gasket is located out on said flange away from said hollow body of said plasma tube so as to protect it from high temperature conditions which occur at the downstream end of said hollow body during plasma processing with said plasma tube.

7. The plasma-based generator of claim 6 wherein said first and second gaskets are O-rings.

8. A plasma-based generator for use with a power source, said generator comprising:
    a plasma tube in which a plasma is generated by said power source, said plasma tube comprising sapphire;
    a first support structure supporting a downstream end of the plasma tube;
    a second support structure supporting an upstream end of said plasma tube, said second support structure surrounding the outside of said plasma tube so as to form a cavity around said plasma tube, said second support structure comprising an outer tube having an inner bore in which said plasma tube is concentrically arranged, said outer tube defining an outer wall of said cavity and being made of a dielectric material that is transparent to microwave energy, said second support structure including an inlet port through which a coolant is introduced into said cavity and an outlet port out of which said coolant flows after passing through said cavity, said plasma tube acting as an inner wall of said cavity so that said coolant comes into direct contact with said plasma tube when introduced into said cavity; and
    a coolant source which supplies water as the coolant.

9. The plasma-based generator of claim 8 wherein said inlet port is located closer to the downstream end of said plasma tube than is said outlet port.

10. The plasma-based generator of claim 8 wherein said plasma tube is cylindrically shaped.

11. The plasma-based generator of claim 10 wherein said outer tube is cylindrically shaped, and wherein said plasma tube and said outer tube are concentrically positioned with respect to each other and with respect to a common axis so as to form a cylindrically shaped flow region surrounding said plasma tube, said cylindrically shaped flow region being part of said cavity.

12. The plasma-based generator of claim 8 further comprising a pump connected between the inlet and outlet ports of said second support structure, said pump circulating said coolant through said cavity during operation.

13. The plasma-based generator of claim 8 wherein said second support structure comprises an expansion joint which changes its length to accommodate a lengthening and a shortening of the plasma tube due to its thermal expansion and contraction when plasma processing is performed within said plasma tube.

14. The plasma-based generator of claim 13 wherein said expansion joint comprises a bellows having a central bore through which the plasma tube passes.

15. The plasma-based generator of claim 8 wherein said plasma tube comprises a hollow body which has an upstream end and a downstream end, wherein during operation a gas flows into said plasma tube through the upstream end and exits through the downstream end after being activated by a plasma generated therein by said power source, wherein said plasma tube further comprises a flange located at the downstream end of said hollow body, and wherein said first support structure comprises a base plate and said second support structure comprises a collar member, wherein said flange is located between and grasped by said collar member and said base plate.

16. The plasma-based generator of claim 15 further comprising a first gasket circumscribing the downstream end of said plasma tube and compressed between the flange and the base plate, said gasket forming a vacuum seal.

17. The plasma-based generator of claim 16 wherein said first gasket is located out on said flange away from said hollow body of said plasma tube so as to protect it from high temperature conditions which occur at the downstream end of said hollow body during plasma processing with said plasma tube.

18. The plasma-based generator of claim 17 further comprising a second gasket around said plasma tube and compressed between the flange and said collar member.

19. The plasma-based generator of claim 18 wherein said second gasket is located out on said flange away from said hollow body of said plasma tube so as to protect it from high temperature conditions which occur at the downstream end of said hollow body during plasma processing with said plasma tube.

20. The plasma generator of claim 19 wherein said first and second gaskets are O-rings.

21. The plasma-based generator of claim 1 wherein said flange comprises sapphire.

22. The plasma-based generator of claim 21 wherein said sapphire flange is integrally formed on said sapphire plasma tube.

23. A plasma-based generator for use with a power source, said generator comprising:

a sapphire plasma tube in which a plasma is generated by said power source;

a first support structure supporting a downstream end of the plasma tube; and a second support structure supporting an upstream end of said plasma tube, said second support structure surrounding the outside of said plasma tube so as to form a cavity around said plasma tube, said second support structure comprising an outer tube having an inner bore in which said plasma tube is concentrically arranged, said outer tube defining an outer wall of said cavity and being made of a dielectric material that is transparent to microwave energy, said second support structure including an inlet port through which a coolant is introduced into said cavity and an outlet port out of which said coolant flows after passing through said cavity, said plasma tube acting as an inner wall of said cavity so that said coolant comes into direct contact with said plasma tube when introduced into said cavity, wherein said plasma tube and said outer tube are both cylindrically shaped and are concentrically positioned with respect to each other and with respect to a common axis so as to form a cylindrically shaped flow region surrounding said plasma tube, said cylindrically shaped flow region being part of said cavity and having a uniform thickness that lies between 0.1 to 0.5 millimeters.

* * * * *